US006242279B1

(12) United States Patent
Ho et al.

(10) Patent No.: US 6,242,279 B1
(45) Date of Patent: Jun. 5, 2001

(54) HIGH DENSITY WIRE BOND BGA

(75) Inventors: Chung W. Ho, Monte Sereno; Anna Litza, Los Gatos, both of CA (US)

(73) Assignee: Thin Film Module, Inc., Hsin-Chu (TW)

( * ) Notice: Subject to any disclaimer, the term of this patent is extended or adjusted under 35 U.S.C. 154(b) by 0 days.

(21) Appl. No.: 09/332,428

(22) Filed: Jun. 14, 1999

(51) Int. Cl.⁷ .................................................. H01L 21/48
(52) U.S. Cl. ............................................. 438/106; 438/106
(58) Field of Search ................................. 438/15, 26, 48, 438/108, 118, 106, 612, 613

(56) References Cited

U.S. PATENT DOCUMENTS

| 5,509,553 | 4/1996 | Hunter, Jr. et al. ................ 216/13 |
| 5,525,834 | 6/1996 | Fischer et al. ..................... 257/691 |
| 5,530,287 | * 6/1996 | Currie et al. ....................... 257/692 |
| 5,578,869 | 11/1996 | Hoffman et al. ................... 257/691 |
| 5,660,697 | 8/1997 | Kawashima et al. ........... 204/192.22 |
| 5,660,738 | 8/1997 | Hunter, Jr. et al. ................ 216/17 |
| 5,723,906 | * 3/1998 | Rush ................................... 257/723 |
| 5,724,232 | * 3/1998 | Bhatt et al. ......................... 361/762 |
| 5,830,563 | 11/1998 | Shimoto et al. ................... 428/209 |
| 5,837,427 | * 11/1998 | Hwang et al. ..................... 430/312 |
| 5,866,942 | 2/1999 | Suzuki et al. ...................... 257/698 |
| 6,080,936 | * 6/2000 | Yamasaki et al. ................. 174/263 |

* cited by examiner

*Primary Examiner*—David Nelms
*Assistant Examiner*—David Nhu
(74) *Attorney, Agent, or Firm*—George O. Saile; Stephen B. Ackerman

(57) ABSTRACT

A new method is provided for creating high-density packages for wire bonded chips. The invention uses a combination of BUM technology and thin film deposition techniques to create the required interface between the contact points of the BGA device and the contact balls of the BGA substrate. Cavities are created on the metal panel substrates for IC chip insertion.

9 Claims, 4 Drawing Sheets

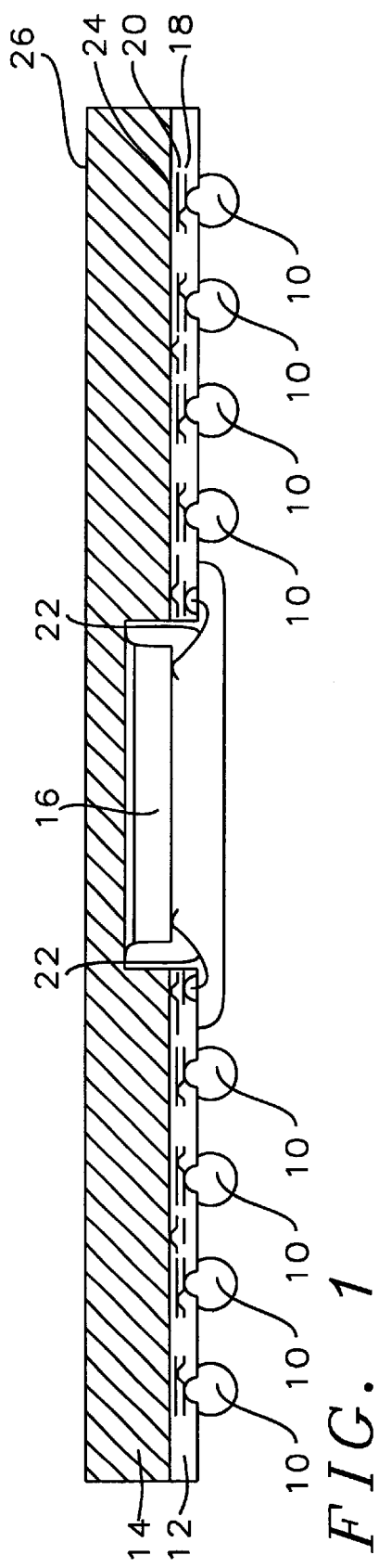
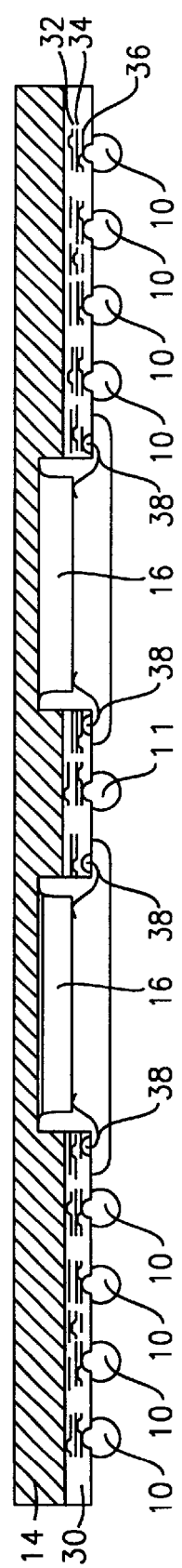

HIGH DENSITY WIRE BOND BGA

This application is related to application Ser. No. 09/332,427, filed on Jun. 14, 1999, assigned to a common assignee.

BACKGROUND OF THE INVENTION

(1) Field of the Invention

The invention relates to the fabrication of integrated circuit devices and more particularly, to a method and structure for making high density packaging substrates for wire bonded chips.

(2) Description of the Prior Art

In the field of high density interconnect technology, it is necessary to fabricate a multilayer structure on the substrate to connect integrated circuits to one another. To achieve a high wiring and packing density, many integrated circuit chips are physically and electrically connected to a single substrate commonly referred to as a multi-chip module (MCM). Typically, layers of a dielectric such as a polyimide separate metal power and ground planes in the substrate. Embedded in other dielectric layers are metal conductor lines with vias (holes) providing electrical connections between signal lines or to the metal power and ground planes. Adjacent layers are ordinarily formed so that the primary signal propagation directions are orthogonal to each other. Since the conductor features are typically narrow in width and thick in a vertical direction (in the range of 5 to 10 microns thick) and must be patterned with microlithography, it is important to produce patterned layers that are substantially flat and smooth (i.e., planar) to serve as the base for the next layer.

Surface mounted, high pin count integrated circuit packages have in the past been configured using Quad Flat Packs (QFP's) with various pin configurations. These packages have closely spaced leads for making electrical connections distributed along the four edges of the flat package. These packages have become limited by being confined to the edges of the flat package even though the pin to pin spacing is small. To address this limitation, a new package, a Ball Grid Array (BGA) is not so confined because the electrical contact points are distributed over the entire bottom surface of the package. More contact points can thus be located with greater spacing between the contact points than with the QFP's. These contacts are solder balls that facilitate flow soldering of the package onto a printed circuit board.

A Ball Grid Array (BGA) is an array of solderable balls placed on a chip carrier. The balls contact a printed circuit board in an array configuration where, after reheat, the balls connect the chip to the printed circuit board. BGA's are known with 40, 50 and 60 mils. spacings in regular and staggered array patterns.

Interconnecting lines and vias are planarized by multiple coatings of a dielectric material such as polyimide which are used to achieve an acceptable degree of planarization. Application of multiple coatings of thick polyimide is time-consuming and creates high stress on the substrate.

In the realm of micron and submicron device features, the conducting interconnections that connect the Integrated Circuit to other circuit or system components become relatively more important and have, with the further miniaturization of the IC, an increasingly negative impact on the circuit performance. Circuit performance parameters such as parasitic capacitance and resistance of the metal interconnections increase, thereby degrading the chip performance significantly. Of most concern in this respect is the voltage drop along the power and ground buses and the RC delay of the critical signal paths. Attempts to reduce the resistance by using wider metal lines result in higher capacitance of these wires.

To solve this problem, the approach has been taken to develop low resistance metal (such as copper) for the wires while low dielectric materials are used in between signal lines.

Recent developments in the creation of semiconductor integrated devices have seen device features being reduced to the micron and sub-micron range. Continued emphasis on improved device performance requires increased device operating speed, which in turn requires that device dimensions are further reduced. This leads to an approach that is applied to Ultra Large Scale Integration (ULSI) devices where multi-levels of metal interconnects are used to electrically interconnect the discrete semiconductor devices on the semiconductor chips. In more conventional approaches, the different levels of interconnect are separated by layers of insulating materials. The various adjacent levels of metal can be interconnected by creating via openings in the interposing insulating layers. Typically, an insulating layer is silicon dioxide. Increased reduction of device size coupled with increased device density requires further reduction in the spacing between the metal interconnect lines in order to accomplish effective interconnects of the integrated circuits. This however is accompanied with an increase in capacitive coupling between adjacent lines, an increase that has a negative impact on device performance and device operating speed. A method must therefore be found whereby devices can be mounted in very close physical proximity without increasing capacitive coupling while also reducing the RC induced time delay of the circuit. One typical approach is to search for insulating layers that have low dielectric constants, ideally the dielectric constant of a vacuum. Another approach is to use electrical conductors for the interconnect lines that have low electrical resistivity thereby reducing the RC time delay. Another approach is to direct the packaging of semiconductor devices in the direction of wafer-like packages. This approach offers the advantages of being able to use standard semiconductor processing equipment and processes while it can readily be adapted to accommodate die shrinkage and to wafer-level burn-in and testing.

The present invention starts with a metal panel, typically made of copper, and takes advantage of a technology known in the art as the Build Up Multilayer (BUM) in combination with thin film deposition techniques to create a substrate for high density packages.

Other Prior Art applications that use metal substrates to package BGA devices consist of Olin's MBGA (U.S. Pat. No. 5,578,869) and MMS's Metal BGA. The MMS approach starts with a 6" wafer form factor but neither of these approaches use BUM technology or thin film deposition techniques as applied in the manufacturing of large area flat panel displays. The resulting manufacturing cost incurred using this approach is high.

Another Prior Art approach is the approach used by Substrate Technology Inc. for the Ultra BGA. In this approach, the BGA substrate is made by creating the BUM on a metal substrate for the wiring of the printed circuit board. Thin film deposition techniques are however not used in this approach which results in limited line density of the overall package. Line width achieved by using this approach is about 50 u while the spacing between the lines is about 50 u. Fan out for high-density BGA devices can therefore only be achieved by creating multiple layers of metal, which makes the manufacturing of the BGA substrate expensive.

U.S. Pat. No. 5,578,869 (Hoffman et al.) shows a (1) metal base/panel for a package.

U.S. Pat. No. 5,866,942 (Suzuki et al.) discloses (1) a laminate package using polyimide and copper foil patterns.

U.S. Pat. No. 5,1660,738 (Hunter, Jr. et al.) and U.S. Pat. No. 5,509,553 (Hunter, Jr et al.) show (3) a metal layer process (DEMR) (see FIG. 5A) that appears to comprise a) sputter plating base b) plating metal (semi-additive plating), see col. 2.

U.S. Pat. No. 5,660,697 (Kawashima et al.) shows a flat panel process (2) using a sputtered SiN dielectric.

U.S. Pat. No. 5,830,563 (Shimoto et al.) discloses a laminate substrate with thin films deposited thereon.

U.S. Pat. No. 5,837,427 (Hwang et al.) shows a (4) BUM process for a metal base/panel PCB.

U.S. Pat. No. 5,525,834 (Fischer et al.) shows a package having a Cu substrate, thin dielectric layers (1–25 um thick) and thin dielectric layers (12 to 75 um), see col. 7 and 8.

SUMMARY OF THE INVENTION

A principle objective of the invention is to provide an inexpensive and reliable method for high-density semiconductor device manufacturing.

Another objective of the invention is to reduce performance limitations imposed by Prior Art high-density semiconductor device manufacturing techniques.

Yet another objective of the invention is to provide for high pin fan-out for semiconductor devices.

Yet another objective of the invention is to provide for increased power dissipation for semiconductor devices.

Yet another objective of the invention is to provide a method of packaging high density semiconductor devices by using Build Up Material (BUM) technology in combination with thin film deposition techniques.

In accordance with the objectives of the invention a new method is provided for creating high-density packages for wire bonded chips. The invention uses a combination of BUM technology and thin film deposition techniques to create the required interface between the contact points of the BGA device and the contact balls of the BGA substrate.

BUM technology is used in the invention to create power supply layers and ground layers where needed. Thin film interconnecting lines are created using thin film deposition techniques.

BRIEF DESCRIPTION OF THE DRAWINGS

FIG. 1 shows a cross section of a high density BGA.

FIG. 2 shows a cross section of a high density BGA with one layer of patterned metal.

FIG. 3 shows a cross section of a multi-chip BGA with three layers of patterned metal.

DESCRIPTION OF THE PREFERRED EMBODIMENTS

Figure 4:
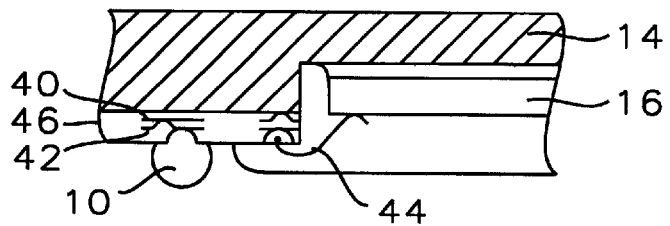
FIG. 4 shows a cross section of a multichip BGA with two layers of patterned metal.

Referring now specifically to FIG. 1, there is shown a cross section of a high density BGA. The metal substrate 14 has two surfaces, a first surface 24 and a second surface 26. A dielectric layer (not shown) is laminated or deposited on the first surface 24 of the metal substrate 14, the interconnect substrate 12 contains two patterned metal layers 18 and 20. Typical dimensions for the metal lines and the dielectric layers of the invention are as follows: the width of the created metal lines and the spacing between the metal lines are between about 12 and 20 um; the thickness of the applied dielectric layers is between about 10 and 40 um.

The interconnect substrate 12 is hereby defined as the structure that contains the totality of the sequence of layers that are created within the scope of the invention for making a high density packaging substrate. The metal layer within the interconnect substrate 12 that is closest to the first surface 24 of the metal substrate 14 is referred to as the bottom layer, the metal layer within the interconnect substrate 12 that is furthest removed from the first surface 24 of the metal substrate 14 is referred to as the top layer.

The metal substrate 14 is, in the cross section as shown in FIG. 1, used as the ground power supply. Layer 20, the bottom layer of the interconnect substrate 12, serves primarily as the power supply layer but can also be used for some fan-out connections.

Figure 5A:
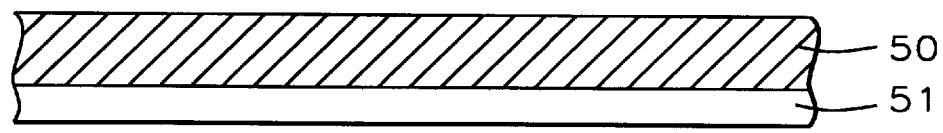
FIG. 5 shows the processing steps used during the thin film deposition process.
Figure 5B:
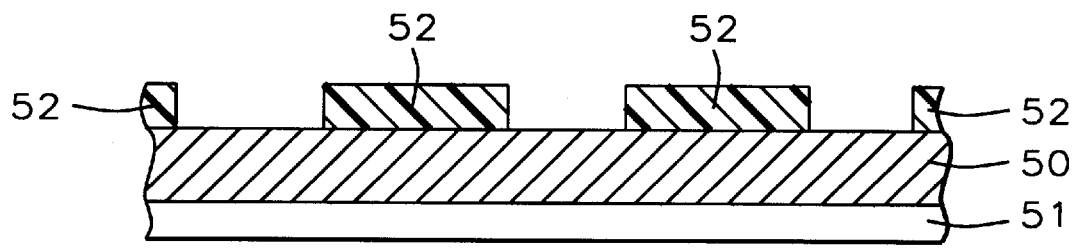
Figure 5C:
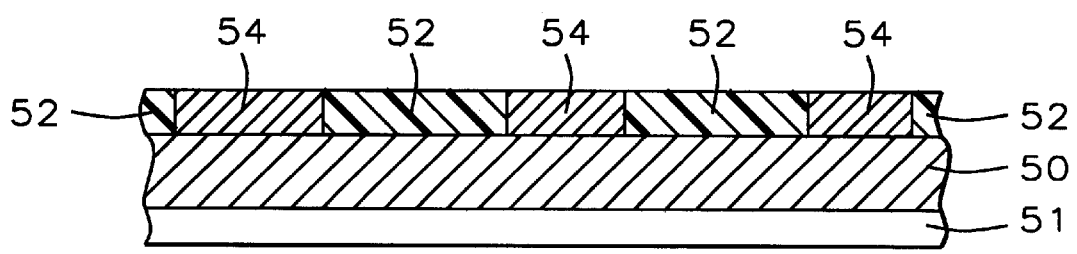
Figure 5D:
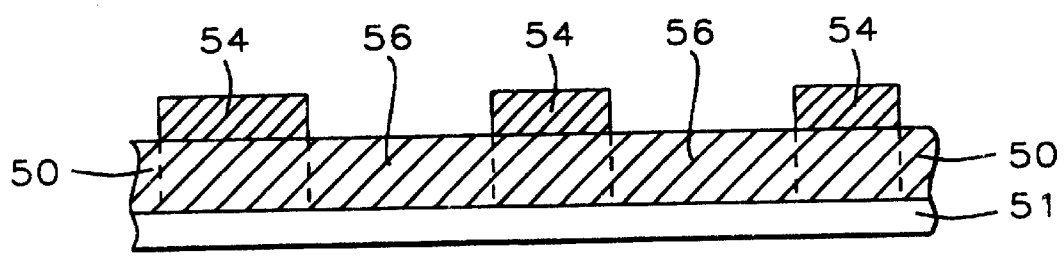
Figure 5E:
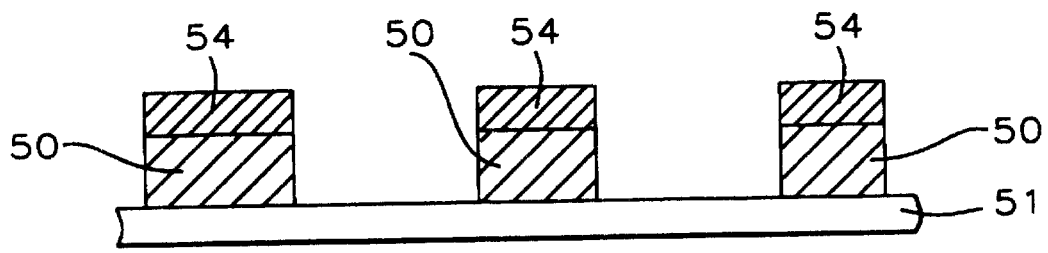
Figure 5F:
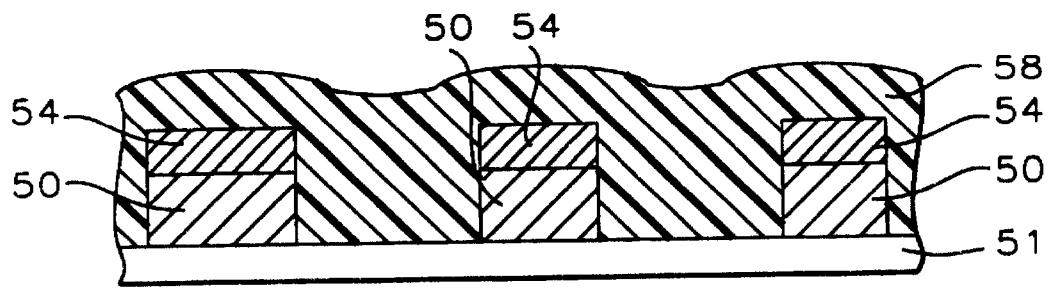

The top layer 18 of the interconnect substrate is created using state of the art thin film deposition techniques. The thin film deposition technique contains the following steps, see FIG. 5:

FIG. 5a, depositing an interconnect plating base 50 by consecutive sputtering of Cr, Cu and Cr on the surface of a layer of dielectric 51;

FIG. 5b, depositing a layer 52 of photoresist on the surface of the plating base 50, masking and patterning (in the reverse pattern of the interconnect lines) the layer 52 of photoresist in preparation for semi-additive plating of the interconnect pattern and wet etching the thin Cr layer to expose the copper layer;

FIG. 5c, depositing semi-additive plating 54 of the interconnect pattern by depositing Cu or Cu, Ni and Au;

FIG. 5d, removing of the mask 52 (FIG. 5b) that was used for the semi-additive plating of the interconnect pattern;

FIG. 5e, wet etching to remove the sputtered plating base 56, FIG. 5d, from between the interconnect pattern 54;

FIG. 5f, coating the created interconnect pattern with a layer 58 of dielectric;

for applications where solder connections need to be made to the interconnect pattern the above dielectric forms a solder mask and vias are created in the dielectric for the solder connections.

Figure 6A:
FIG. 6 shows the processing steps used during the BUM process.
Figure 6B:
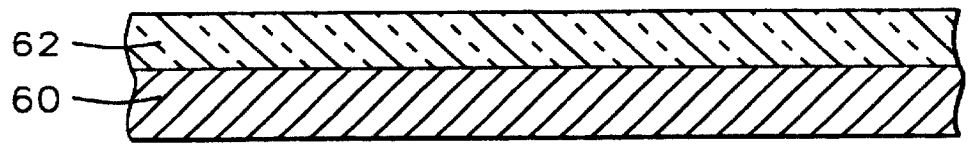
Figure 6C:
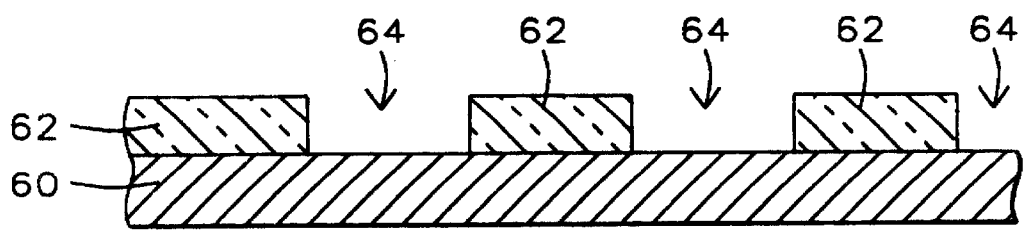
Figure 6D:
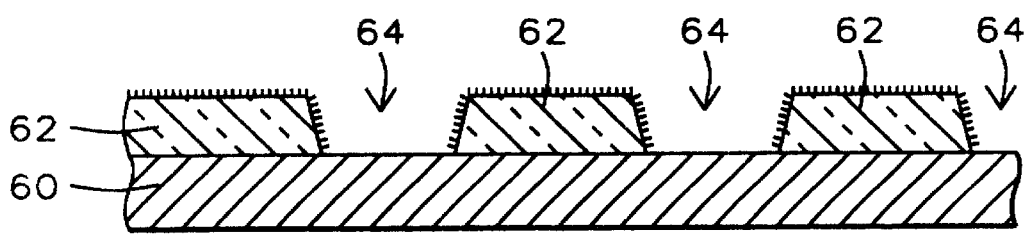
Figure 6E:
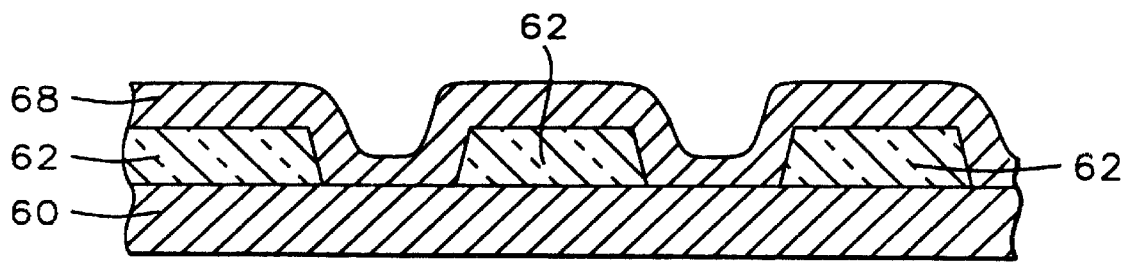
Figure 6F:
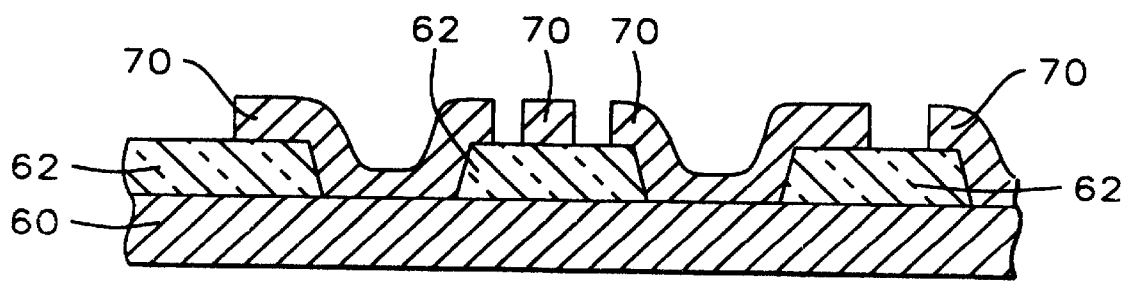

Layer 20 is created using state of the art BUM fabrication technology. This technology contains the following processing steps, see FIG. 6:

FIG. 6a, the starting substrate 60 can be a metallized or it can also be a cleaned metal substrate panel without any interconnect layers;

FIG. 6b, coating of the substrate 60 with a layer 62 of dielectric;

FIG. 6c, creating of vias 64 in the dielectric 62 for electrical connections to the substrate 60;

FIG. 6d, etching and swelling of the dielectric 62 to roughen the surface and thereby promote adhesion for the subsequent electroless copper deposition;

It must be noted that the thickness of the dielectric that is applied in the above sequence must be considerably less than the thickness of dielectric layers typically used in the BUM process which are between about 50 and 75 um. This objective can also be reached by creating the layer of dielectric by curtain coating or by spinning or a combination of spinning and extrusion steps that are typically used in the flat panel display industry to create thin layers of dielectric.

The process of electroless seeding creates a continuous metal film that is used as a plating base for the subsequent panel plating and the wet etch processing steps. The process of electroless seeding contains a series of steps that are used in the Printed Wiring Board (PWB) industry as applied to a dielectric (e.g. epoxy). These steps consist of conditioner, micro-etch, pre-dip, catalyze, accelerate and metalize and are aimed at creating a thin layer of continuous copper film.

Further highlighted in FIG. 1 are the BGA contact balls 10, the integrated circuit (chip) 16 and bond wires 22. The BGA contact balls form the contact points between the total package of the high density BGA and the underlying interconnect configuration. The bond wires 22 establish the contact between the IC and the interconnect substrate 12.

The openings that are created to contact the first surface 24 of the interconnect substrate for the patterned metal layer 20 can be created using laser technology. This offsets the expense of conventional (mechanical) drilling of contact holes in this surface by offering increased speed and accuracy.

The Integrated Circuit 16 is inserted into an opening that has been etched or milled mechanically for this purpose in the first surface 24 of the metal substrate 14. It is clear from the cross section as shown in FIG. 1, the opening into which the IC chip is inserted can be of any dimension and can readily be adapted to either BGA or LGA or PGA devices of any dimension. It is further clear that more than one opening can be created in the first surface 24 of the metal substrate 14 thereby creating device packages that can contain more than one IC chip in the same BGA or LGA or PGA device.

FIG. 2 shows a cross section where only one patterned layer 28 is created using the above-indicated thin film deposition techniques. This layer serves as both the signal interconnect layer and the power supply layer, the metal substrate 14 remains the ground power supply layer.

Prior to the deposition of the thin film interconnecting pattern, the surface of the metal substrate 14 is cleaned, coated with a dielectric and vias are opened in the dielectric for connection the metal substrate (which serves as ground power supply). After the metal substrate 14 has been prepared in this manner, the thin film deposition process that has been highlighted above is applied to the top surface of the dielectric, the interconnect plating base establishes electrical contact between the layer of interconnecting lines and the metal substrate, while, after the interconnecting line pattern has been formed, the plating base is etched off to isolate the interconnecting lines, the dielectric deposited over the interconnecting lines patterns insulates the pattern.

The metal substrate has planar dimensions (typically 18"×24") that allow for a multiplicity of BGA packages to be created within one metal substrate. After this process of creating the BGA packages is complete, the metal substrate is sub-divided (by cutting or scoring) thereby creating individual BGA packages.

The basic design of creating one BUM layer followed by one or more thin film deposited layers of interconnect lines can be used to package more than one chip. This is shown in FIG. 3 which shows a cross section of a two chip BGA package with three layers of patterned metal within the interconnect substrate. The interconnect substrate 30 contains layers 32, 34 and 36. Layer 32, the bottom layer, serves as the power layer, layers 34 and 36 are created using thin film deposition technology. Also highlighted are the bond wires 38. Layer 32 is created using the above highlighted BUM technology, layers 34 and 36 have been created using the above highlighted thin film processing techniques.

FIG. 3 shows the previously indicated example of two openings that have been etched or milled into the first surface of the metal substrate 14. The BGA contact ball 11 is connected to the part of the interconnect substrate that resides between the two openings that have been created in the metal substrate 14 and is, as such, a part of the interconnect substrate.

FIG. 4 shows a cross section of a multi-chip BGA package where two patterned layer 40 and 42 have been created in the interconnect substrate 46. Both layers 40 and 42 have been created using thin film deposition techniques. Bond wire 44 is highlighted.

It must further again be emphasized that it is clear from the above that the invention is not limited to a fixed number of BUM layers or interconnect layers that can be deposited on the first surface of said metal substrate. Multiple layers of dielectric can be combined with the deposition of multiple BUM layers and/or interconnect layers. Limitations that are imposed on the overall structure are limitations that are imposed due to such electrical design restraints as propagation delay, line resistivity, capacitive coupling, RC-time constant delay, dielectric constants between deposited layers, and others. The invention therefore provides the means of constructing high density BGA/LGA/PGA packages without, due to the nature of the invention, imposing any constraints on these packages. It further follows that the number of cavities that are created in the first surface of the metal substrate or the size of the created cavities can be selected at will and can be dictated by design requirements without being limited in this selection by limitations imposed by the invention.

Although the preferred embodiment of the present invention has been disclosed for illustrative purposes, those skilled in the art will appreciate that various modifications, additions and substitutions are possible without departing from the scope and spirit of the invention as disclosed in the accompanying claims.

What is claimed is:

1. A method of mounting a Ball Grid Array chip comprising:

providing a metal substrate said metal substrate having a first surface and a second surface;

creating a thin film layer over said first surface of said metal substrate, said thin film layer having a first and a second surface whereby selected points of said second surface are in electrical contact with said first surface of said metal substrate, said thin film layer being created using a combination of printed wiring board equipment such as plating and wet etch and Build Up Multi-layer (BUM) equipment such as a dielectric coater and laser via and thin film deposition equipment such as a sputter or a projection printer;

exposing the metal pads within said first surface of said thin film layer thereby creating openings for wire bond connections in addition to BGA solder connections;

milling said first surface of said metal substrate thereby creating an opening for the insertion of said GBA chip;

inserting a BGA chip into said opening in said first surface of said metal substrate;

connecting bond wires between said BGA chip and openings for wire bond connections created in said thin film layer;

inserting BGA contact balls into said openings in said first surface of said thin film for BGA solder connections;

heat-treating said BGA device, establishing electrical contacts between said BGA contact balls and said first surface of said thin film layer; and subdividing said metal substrate into individual BGA substrates.

2. The method of claim 1 wherein said creating a thin film layer comprises the steps of:

cleaning the first surface of said metal substrate;

treating said first surface with an adhesion promotion step such as an oxidation growth step;

coating of said metal substrate with a first layer of dielectric such as curtain coating or roller coating;

creating of vias in said first layer of dielectric for electrical connections to the metal substrate;

sputter depositing an interconnect plating base having a surface over said first layer of dielectric by depositing a first layer of Cr, a first layer of Cu, and a second layer of Cr;

depositing a layer of photoresist over said interconnect plating base;

masking and patterning said layer of photoresist, creating a mask of photoresist;

etching the second layer of Cr to expose portions of the underlying first layer of Cu contained within said interconnect plating base;

forming a semi-additive plating on said exposed portions of the underlying Cu contained within said interconnect plating base by depositing a second layer of Cu, a first layer of Ni and a first layer of Au;

removing said mask of photoresist to expose portions of said interconnect plating base; and etching said exposed portions of said interconnect plating base to form an interconnect pattern comprising said interconnect plating base and said semi-additive plating.

3. The method of claim 2 wherein coating of said metal substrate with a first layer of dielectric is creating a layer of dielectric with a thickness between about 10 and 40 um.

4. The method of claim 1 wherein said exposing the metal substrate or metal pads within said first surface of a metal layer is performed using laser technology thereby creating laser vias.

5. The method of claim 1 wherein said milling said first surface of said metal substrate is a mechanical milling or an etchback of said first surface of said metal substrate.

6. The method of claim 1 wherein said metal substrate contains an element selected from the group of copper or aluminum or stainless steel.

7. The method of claim 1 wherein said metal substrate is about 40 mills thick and has planar dimensions that are large enough to provide for one or more surfaces each having dimensions of about 18×24 inches.

8. The method of claim 2 wherein said first layer of dielectric contains an element selected from the group of epoxy with or without glass reinforcement or polyimide or a composite dielectric and is deposited to a thickness between about 10 and 40 um using either lamination techniques or coating and curing techniques.

9. The method of claim 1 wherein said Grid Array is selected from the group consisting of Ball Grid Array (BGA), Land Grid Array (LGA) and Pin Grid Array (PGA).

* * * * *